United States Patent
Zur et al.

(10) Patent No.: US 9,577,684 B1
(45) Date of Patent: *Feb. 21, 2017

(54) HIGH FREQUENCY TIME INTERLEAVED DIGITAL TO TIME CONVERTER (DTC)

(71) Applicant: Intel IP Corporation, Santa Clara, CA (US)

(72) Inventors: Sarit Zur, Petah-Tikva (IL); Ofir Degani, Haifa (IL); Rotem Banin, Pardes-Hana (IL); Assaf Ben-Bassat, Haifa (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/952,903

(22) Filed: Nov. 25, 2015

(51) Int. Cl.
*H04L 25/49* (2006.01)
*H04B 1/04* (2006.01)
*H04L 27/20* (2006.01)

(52) U.S. Cl.
CPC ............. *H04B 1/0475* (2013.01); *H04L 27/20* (2013.01); *H04B 2001/045* (2013.01)

(58) Field of Classification Search
CPC . H04B 1/0475; H04B 2001/045; H04L 27/20; H04L 27/22; H03M 1/822; H03M 1/74; H03M 1/68
See application file for complete search history.

(56) References Cited

U.S. PATENT DOCUMENTS

| | | | | |
|---|---|---|---|---|
| 5,489,864 | A * | 2/1996 | Ashuri | H03K 5/131 327/105 |
| 9,054,925 | B1 * | 6/2015 | Madoglio | H04L 27/20 |
| 9,071,304 | B2 | 6/2015 | Banin et al. | |
| 9,137,084 | B2 | 9/2015 | Degani et al. | |
| 9,191,147 | B1 * | 11/2015 | Sheahan | H04L 1/0001 |
| 2010/0183066 | A1 * | 7/2010 | Chen | H03M 1/661 375/239 |
| 2014/0002287 | A1 * | 1/2014 | Klepser | H04L 27/2003 341/144 |
| 2014/0266822 | A1 * | 9/2014 | Henzler | G04F 10/005 341/118 |
| 2016/0056827 | A1 * | 2/2016 | Vlachogiannakis | H03B 5/1265 327/158 |

OTHER PUBLICATIONS

Zhiyu Ru, et al., "A High-Linearity Digital-to-Time Converter Technique: Constant-Slope Charging", IEEE Journal of Solid-State Circuits, vol. 50, No. 6, Jun. 2015, pp. 1412-1423.

* cited by examiner

*Primary Examiner* — Syed Haider
(74) *Attorney, Agent, or Firm* — Forefront IP Lawgroup of Christie and Rivera, PLLC

(57) ABSTRACT

Described herein are technologies related to an implementation of a time interleaved digital-to-time converter (DTC) topology to generate high frequency phase modulated local oscillator (LO) signals. A first and second DTC are connected to an oscillator where outputs of the two DTCs are combined to generate a phase modulated signal and the two DTCs have a frequency rate that is half the frequency rate of the phase modulated signal. The two DTCs can operate at a 50 percent or lower duty cycle.

19 Claims, 6 Drawing Sheets

HIGH FREQUENCY TIME INTERLEAVED DIGITAL TO TIME CONVERTER (DTC)

BACKGROUND

A Digital Polar Transmitter (DPTX) architecture may provide a reduced size and a reduced power consumption when compared to a conventional analog radio transmitter architecture. For example, a DPTX architecture may include two main functional blocks. One main functional block is a Digital-to-Time Converter (DTC) that modulates a local oscillator (LO) carrier with phase information of a signal that is to be transmitted. While the other main functional block is a Digital Power Amplifier (DPA) that modulates the amplitude of the signal that is to be transmitted onto the phase-modulated LO signal, thereby generating a reconstruction of the original signal (e.g., the signal to be transmitted).

In modern technologies we aim to implement the DPTX in order to improve key performance indicators and to achieve better power consumption, efficiency and compatibility. For example, the DTC in the transmission chain has a very low jitter frequency offset generator and may be further used in the receive chain. However, technologies such as 5G cellular and Wi-Fi 11ac/11ax drive carrier frequency to higher frequencies in order to achieve higher signal bandwidth (BW). To this end, present phase modulator topologies are problematic when implemented to operate at high frequencies due to timing issues and power consumption which increase exponentially with frequency.

DETAILED DESCRIPTION

Described herein is a technology for implementing a time interleaved digital-to-time converter (DTC) in a device. Particularly, the time interleaved DTC as described includes a combination of at least two parallel DTCs where each DTC independently operates on a half rate of a desired local oscillator (LO) signal rate or a phase modulated LO signal. For example, each of the at least two parallel DTCs is coupled to a common voltage controlled oscillator (VCO), and each DTC further operates on quarter rate of the VCO's output clock rate. When the two DTCs are combined, the modulated LO signal at half VCO frequency rate is generated. In this example, each DTC is configured to operate on low duty cycle (e.g., 25% duty cycle), in order that both DTC outputs are independent and may be added together in open loop, with no need in high rate signal, or actually no need in any additional signal for the combination between the two.

For synchronization, the first DTC of the at least two DTCs is first activated and after two VCO cycles, the second DTC is thereafter activated to generate 180 degrees out of phase signal difference between the two parallel DTCs. From that point, the at least two DTCs are synchronized and are independent in their operation without need of further synchronization.

With the synchronized parallel DTCs, each DTC output of the at least two DTCs is subsequently fed to a digital logic controller gate (i.e., an OR gate) to generate a phase modulated LO output that may include about 50% duty cycle. As described herein, the phase modulated LO output has a higher signal rate (i.e., twice the rate of the signal generator) and a minimized power consumption as well due to the low operation rate of each generator.

The combination of the example—at least two parallel DTCs and the OR gate—may form a time interleaved DTC topology as described herein. The higher signal rate output of the time interleaved DTC topology may be facilitated by the number of parallel DTCs used. For example, for two parallel half rate DTCs with 25% duty cycle, the phase modulated LO output has twice the rate of each DTC rate. In this example, an operation of the half rate DTC may adapt in part and whenever applicable the DTC as described in Pub. No. US 2015/0036767 entitled, "Digitally Controlled Edge Interpolator (DCEI) for Digital to Time Converters (DTC)."

The time interleaved DTC topology as described above may be used for frequency generation, internal clocking, signal modulation, and the like, in wireless devices, stand-alone devices, etc.

Figure 1:
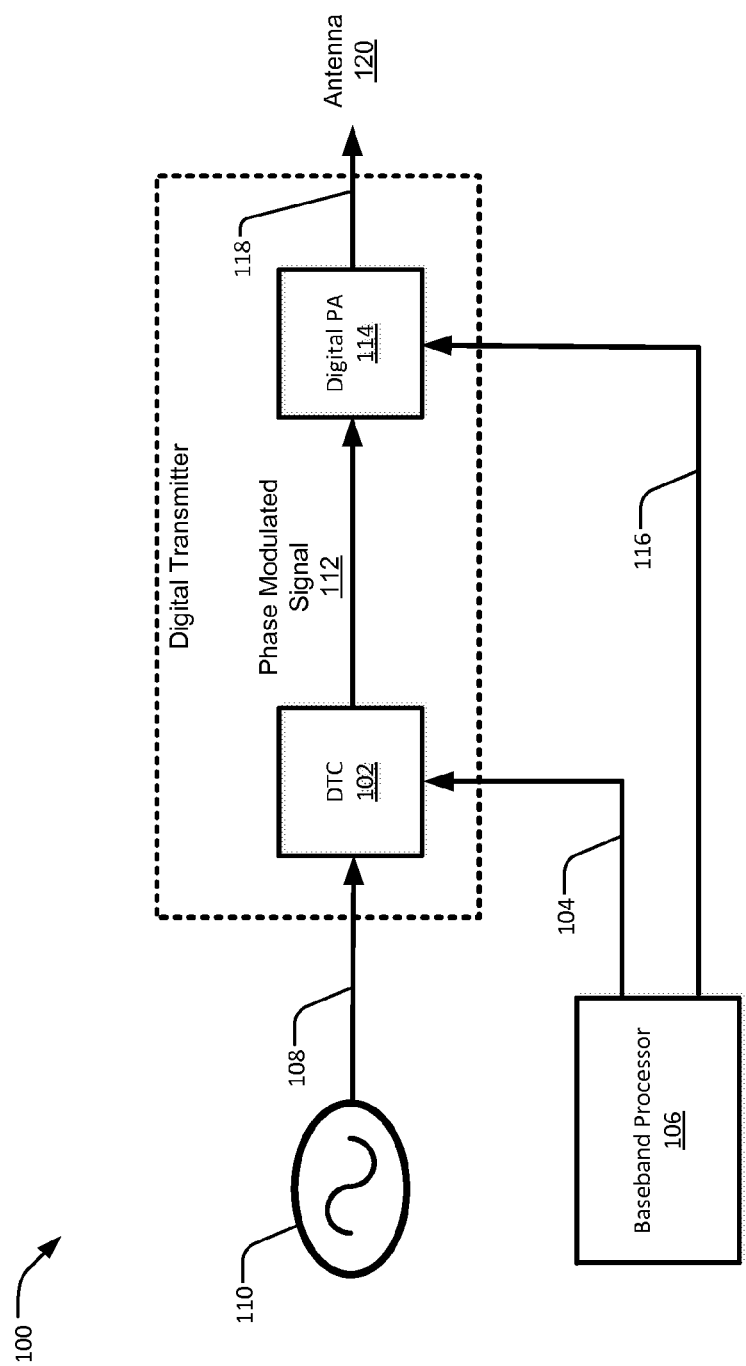
FIG. 1 illustrates an example block diagram of a digital polar transmitter as described in present implementations herein.

FIG. 1 is a block diagram of an example digital polar transmitter 100 that implements the time interleaved DTC topology as described in present implementations herein. As shown, the digital polar transmitter 100 includes a time interleaved DTC 102 that is configured to receive a phase data signal 104 (i.e., control word) from a base band processor 106, and a signal 108 from a signal generator, VCO 110 (or digitally controlled oscillator). Based on the received signal 108 and the received phase data signal 104 as control signals, the DTC 102 is configured to output a phase-modulated signal 112 (or phase modulated LO output).

The phase modulated signal 112 is received by a digital power amplifier (P/A) 114 and amplitude modulated by an amplitude control signal 116 to generate a (phase and amplitude) modulated radio frequency (RF) signal 118. The modulated RF signal 118 may be transmitted through one or more antennas 120.

As further discussed below and illustrated in FIG. 2, the DTC 102 is implemented as a combination of parallel independently controlled DTCs where each output of the independently controlled DTCs is combined through a digital logic gate 206 to generate the phase-modulated signal 112.

In an implementation, the parallel independently controlled DTCs include at least two DTCs where each DTC operates on a quarter rate of the signal 108 (i.e., received from the VCO 110). Each of the at least two DTCs may be configured to operate, for example, on a substantially lower duty cycle such as 25% duty cycle. In this example, the 25% duty cycle may allow use of a single edge sampling (e.g., rising edge) in the time interleaved DTC 102 in order to avoid doubling data rate and thereby saving more power consumption for the digital polar transmitter 100.

To synchronize the parallel DTC components (not shown) of the DTC 102, each of the DTC components (e.g., two DTCs) may be activated at a separate time period such as a difference of two VCO cycles between activation period in order for one DTC to lag the other DTC by 180 degrees. In this example, each output of the DTC is combined and processed through the digital logic OR gate in order to generate the phase modulated signal 112, with a total of 50% duty cycle for the given example above.

In some embodiments, the digital polar transmitter 100 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly.

In some embodiments, the portable wireless communication device may include one or more of a keyboard, a display, a non-volatile memory port, multiple antennas, a graphics processor, an application processor, speakers, and other mobile device elements. The display may be a LCD screen including a touch screen. In some embodiments, the digital transmitter 100 may be part of a mobile communication device and is coupled to one or more antennas 120 configured for transmission of orthogonal frequency division multiplexed (OFDM) signals in a 3GPP LTE network.

The antennas 120 may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, the antennas may be effectively separated to take advantage of spatial diversity and the different channel characteristics that may result between each of antennas and the antennas of a transmitting station.

Figure 2:
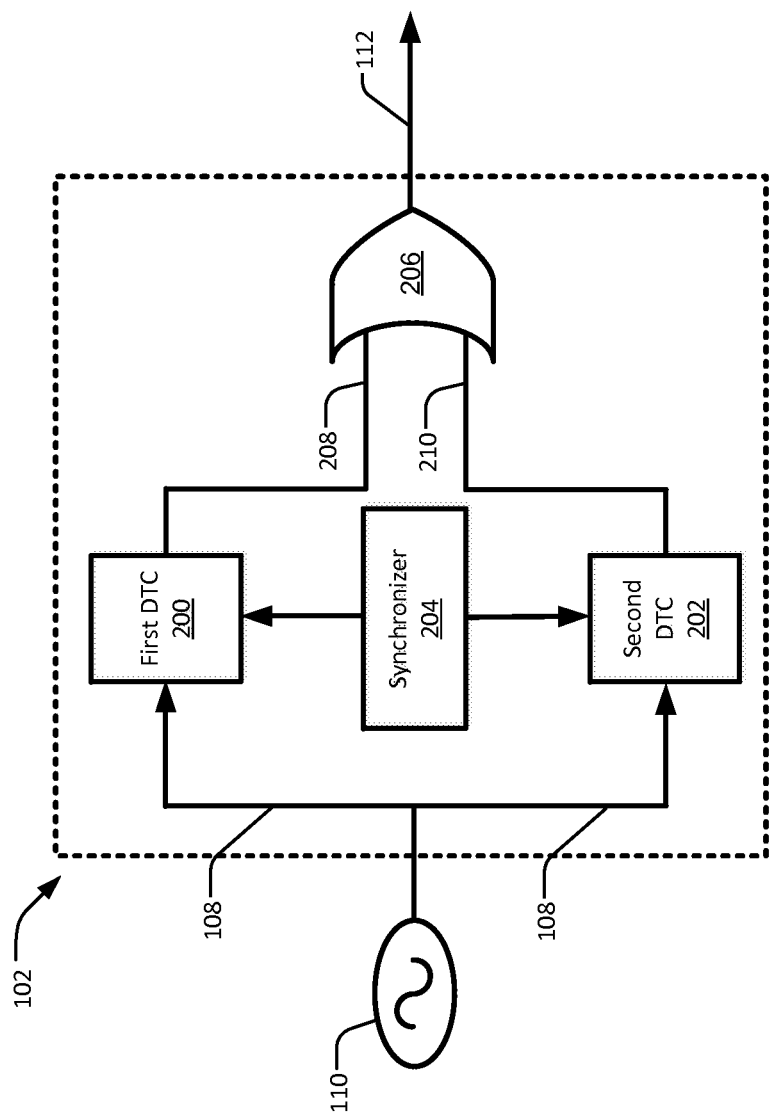
FIG. 2 illustrates an example topology of a time interleaved digital to time converter (DTC) in accordance with implementations described herein.

FIG. 2 is an example topology of the time interleaved DTC 102 as described in present implementations herein. As shown, the time interleaved DTC 102 may include a first DTC 200, a second DTC 202, a synchronizer 204, and a simple logic controller gate 206. The first and second DTCs 200-202 are connected in parallel and receive the same signal 108 from the signal generator—VCO 110. Furthermore, the first and second DTCs 200-202 generates a first DTC output 208 and a second DTC output 210, respectively, where the first and second DTC outputs 208-210 are fed to the logic controller gate 206 to generate the phase modulated signal 112.

As described herein, the first DTC 200 may be implemented as a half rate—DTC component that utilizes a substantially low duty cycle. For example, the first DTC 200 that is coupled to the VCO 110 is using a frequency rate that is about the same clock rate or frequency rate of the signal 108; however, the first DTC 200 has half the frequency rate of the phase modulated signal 112. In this example, the half rate—first DTC 200 is further configured to utilize about 25% duty cycle to produce the first DTC output 208.

Similarly, the second DTC 202 may be implemented as a half rate—DTC component that utilizes a substantially low duty cycle as well. For example, the second DTC 202 that is coupled to the VCO 110 is using a frequency rate that is half of the clock rate or frequency rate of the phase modulated signal 112. In this example, the half rate—second DTC 202 is further configured to utilize about 25% duty cycle to produce the second DTC output 210.

As described herein, half-rate DTC (DTC 202) includes half the frequency rate of the generated phase modulated signal 112.

To synchronize the first DTC 200 and the second DTC 202, the synchronizer 204 is configured to initially activate the second DTC 202 two VCO cycles after the first DTC 200 (i.e., a total of 180°). To this end, the half rate—first DTC 200 and the half rate—second DTC 202, which utilize about 25% duty cycle during phase modulations, may respectively generate the first DTC output 208 and the second DTC output 210 that do not overlap with one another as further illustrated in FIG. 3 below.

With the non-overlapping of the first DTC output 208 and second DTC output 210, there is no need to control both rising and falling edges (see cited Pub. No. US 2015/0036767 above) since the pulse is completely and independently controlled by each of the first DTC 200 and the second DTC 202. Instead, as described herein, each of the first DTC 200 and the second DTC 202 may be configured to control one edge such as the rising edge, and have a constant pulse width at the first DTC output 208 and the second DTC output 210, respectively, to generate the phase modulated signal 112.

With continuing reference to FIG. 2, the logic controller gate 206 may be implemented as an "OR" gate that generates a high output in case the first DTC output 208 and/or the second DTC output 210 is high. For two parallel DTC components (i.e., half rate—first DTC 200 and the half rate—second DTC 202), the logic controller gate 206 may generate the phase modulated output 112 that includes a signal rate that has twice the signal rate of the signals 208 and 210. Furthermore, due to the use of 25% duty cycle by the half rate—first DTC 200 and the half rate—second DTC 202, the phase modulated output 112 may include 50% duty cycle. Furthermore still, because of the non-overlapping between the first DTC output 208 and the second DTC output 210, the logic controller gate 206 consumes minimal power due to a minimal number of components to generate the high frequency phase modulated output 112.

Figure 3:
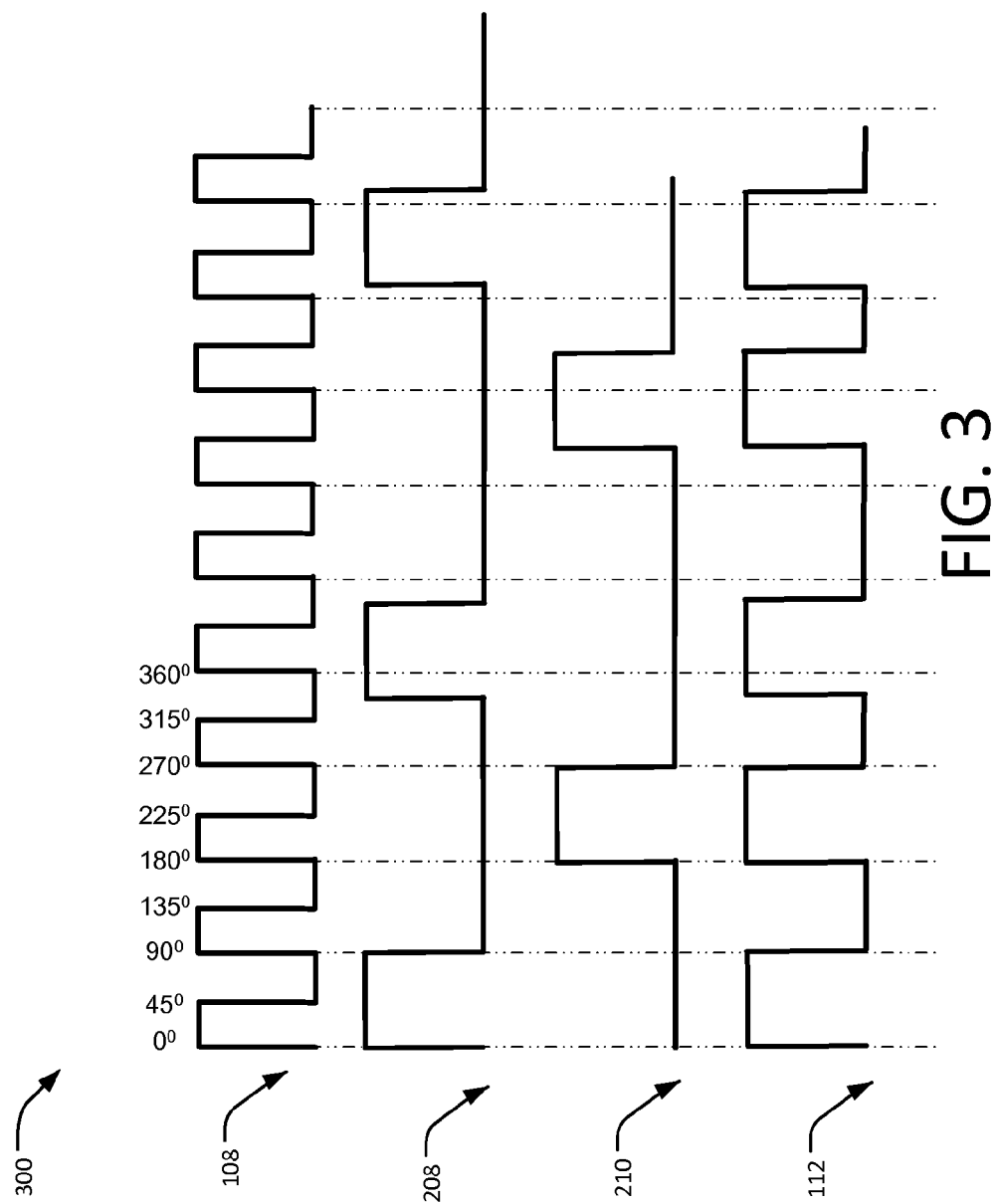
FIG. 3 is an example timing diagram of a time interleaved digital to time converter (DTC) as described in present implementations herein.

FIG. 3 is an example timing diagram 300 of the time interleaved DTC 102 as described in present implementations herein. As shown, the timing diagram 300 shows: the first DTC output 208 that is activated first by the synchronizer 204; the second DTC output 210 that is activated two VCO cycles later by the same synchronizer 204; and the phase modulated output 112 at the output of the logic controller gate 206.

As described herein, the time interleaved DTC 102 may include parallel and independent DTC components (i.e., half rate—first DTC 200 and the half rate—second DTC 202) that utilize the signal 108 at different time periods. For example, the first DTC 200 has a 25% duty cycle (e.g., 90°) and is first activated within two VCO cycles (i.e., within 180°) to generate the first DTC output 208. Thereafter, the second DTC 202 with the same duty cycle (i.e., 25%) is activated two VCO cycles later to generate the second DTC output 210. In these examples, the first DTC 200 and the second DTC 202 are independently controlled by the phase control signal 104 from the baseband processor 106.

Using the OR gate as the logic controller gate 206, the phase modulated output 112 has a high output when the first DTC output 208 and/or the second DTC output 210 is high.

Figure 4:
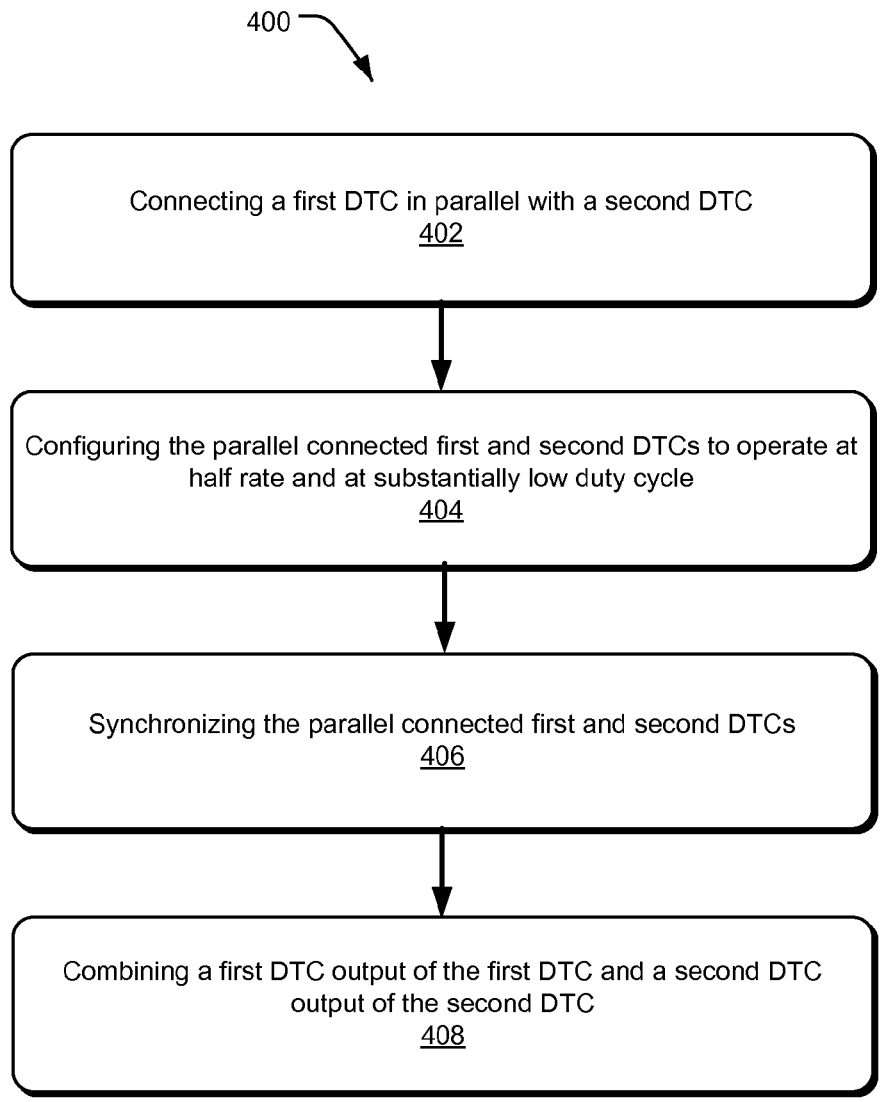
FIG. 4 illustrates an example flowchart for implementing a high frequency time interleaved digital to time converter (DTC) as described in present implementations herein.

FIG. 4 shows an example process flowchart 400 illustrating an example method for implementing a high frequency time interleaved DTC. The order in which the method is described is not intended to be construed as a limitation, and any number of the described method blocks may be combined in any order to implement the method, or alternate method. Additionally, individual blocks may be deleted from the method without departing from the spirit and scope of the subject matter described herein. Furthermore, the method may be implemented in any suitable hardware, software, firmware, or a combination thereof, without departing from the scope of the invention.

At block 402, connecting a first DTC in parallel with a second DTC is performed. For example, the first DTC 200 (i.e., first DTC) and the second DTC 202 (i.e., the second DTC) are connected in parallel. In this example, each of the first DTC 200 and the second DTC 202 may be independently controlled by separate phase control signal 104 from the baseband processor.

At block 404, configuring the parallel connected first DTC and the second DTC to operate at half rate and substantially low duty cycle is performed. For example, the first DTC 200 and the second DTC 202 are configured to operate at half the rate of the desired generated phase modulated signal 112. In this example, the parallel connected first DTC 200 and the second DTC 202 are further configured to utilize 25% duty cycle of their respective half rate signals.

At block 406, synchronizing the parallel connected first DTC and the second DTC is performed. For example, the first DTC 200 is activated first and two VCO cycles later, the second DTC 202 is thereafter activated to avoid overlapping between the two parallel connected DTCs.

At block 408, combining a first DTC output and a second DTC output of the first DTC and the second DTC, respectively, is performed. For example, the logic controller gate 206 (i.e., OR gate) is utilized to combine the first DTC output 208 and the second DTC output 210 to generate an orthogonal phase modulated signal 112 with 50% duty cycle. In this example, the phase modulated signal 112 may include twice the frequency rate of the first DTC output 208 or the second DTC output 210.

Figure 5:
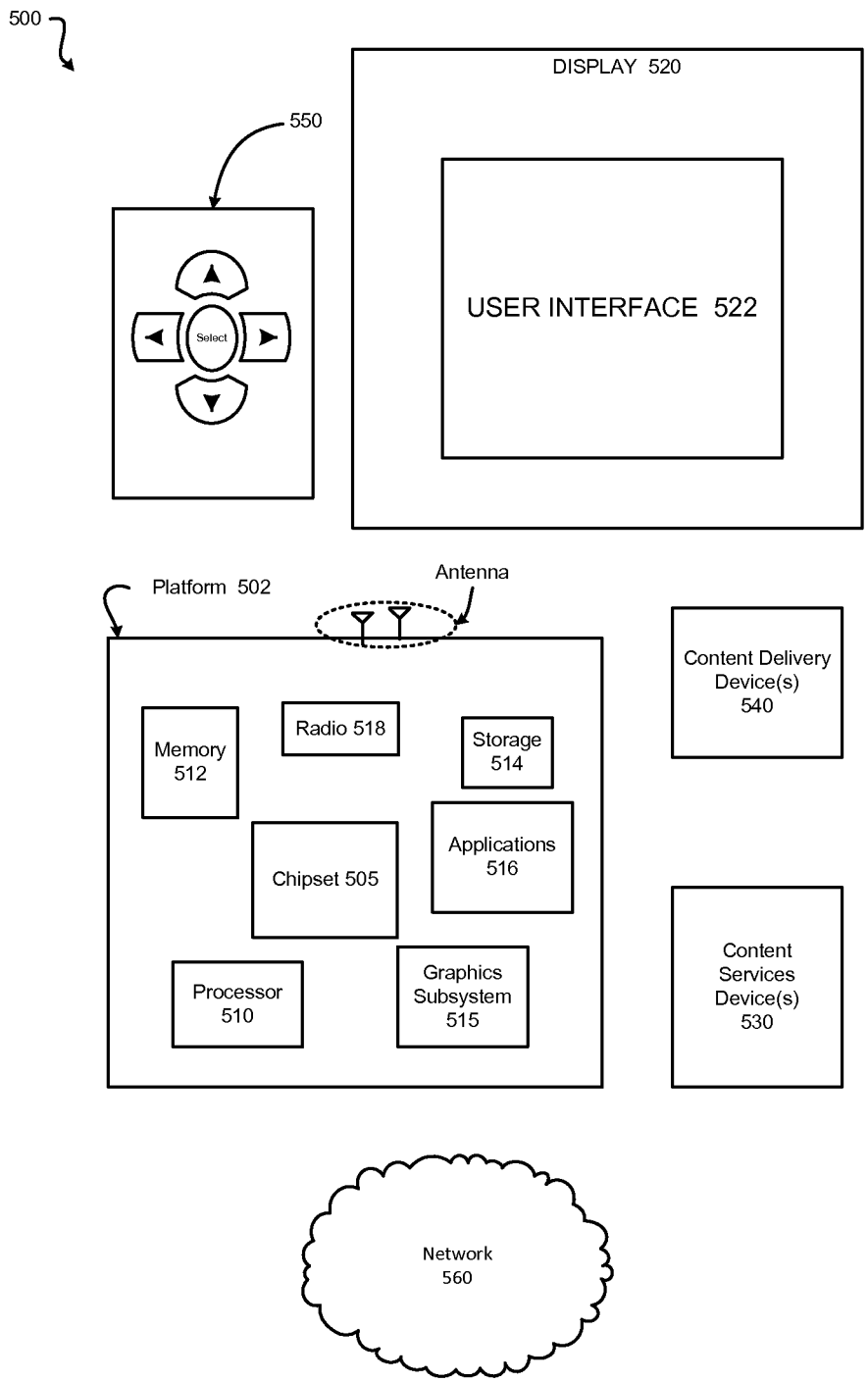
FIG. 5 illustrates an example system of a wireless device that utilizes the time interleaved digital to time converter (DTC) described in accordance with implementations herein.

FIG. 5 illustrates an example system 500 of a wireless device in accordance with the present disclosure. For example, the DTC 102 is a circuitry block within the example system 500. In various implementations, the system 500 may be a media system although system 500 is not limited to this context. For example, system 500 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In various implementations, system 500 includes a platform 502 coupled to a display 520. Platform 502 may receive content from a content device such as content services device(s) 530 or content delivery device(s) 540 or other similar content sources. A navigation controller 550 including one or more navigation features may be used to interact with, for example, platform 502 and/or display 520. Each of these components is described in greater detail below.

In various implementations, platform 502 may include any combination of a chipset 505, processor 510, memory 512, storage 514, graphics subsystem 515, applications 516 and/or radio 518. Chipset 505 may provide intercommunication among processor 510, memory 512, storage 514, graphics subsystem 515, applications 516 and/or radio 518. For example, chipset 505 may include a storage adapter (not depicted) capable of providing intercommunication with storage 514.

Processor 510 may be implemented as a Complex Instruction Set Computer (CISC) or Reduced Instruction Set Computer (RISC) processors, x86 instruction set compatible processors, multi-core, or any other microprocessor or central processing unit (CPU). In various implementations, processor 510 may be dual-core processor(s), dual-core mobile processor(s), and so forth.

Memory 512 may be implemented as a non-volatile memory device such as, the PCM memory cell. In an implementation, the memory 512 is coupled to the processor 510 and a transceiver circuit (e.g., radio 518), which utilizes the DTC 102 in its circuitry block.

Storage 514 may be implemented as another non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In various implementations, storage 514 may include technology to increase the storage performance enhanced protection for valuable digital media when multiple hard drives are included, for example.

Graphics subsystem 515 may perform processing of images such as still or video for display. Graphics subsystem 515 may be a graphics processing unit (GPU) or a visual processing unit (VPU), for example. An analog or digital interface may be used to communicatively couple graphics subsystem 515 and display 520. For example, the interface may be any of a High-Definition Multimedia Interface, Display Port, wireless HDMI, and/or wireless HD compliant techniques. Graphics subsystem 515 may be integrated into processor 510 or chipset 505. In some implementations, graphics subsystem 515 may be a stand-alone card communicatively coupled to chipset 505.

The graphics and/or video processing techniques described herein may be implemented in various hardware architectures. For example, graphics and/or video functionality may be integrated within a chipset. Alternatively, a discrete graphics and/or video processor may be used. As still another implementation, the graphics and/or video functions may be provided by a general-purpose processor, including a multi-core processor. In further embodiments, the functions may be implemented in a consumer electronics device.

Radio 518 may include one or more radios capable of transmitting and receiving signals using various suitable wireless communications techniques. Such techniques may involve communications across one or more wireless networks. Example wireless networks include (but are not limited to) wireless local area networks (WLANs), wireless personal area networks (WPANs), wireless metropolitan area network (WMANs), cellular networks, and satellite networks. In communicating across such networks, radio 518 may operate in accordance with one or more applicable standards in any version. Furthermore, the radio 518 is a part of a transceiver block in the system 500 that may utilize the DTC 102 in its circuitry block.

In various implementations, display 520 may include any television type monitor or display. Display 520 may include, for example, a computer display screen, touch screen display, video monitor, television-like device, and/or a television. Display 520 may be digital and/or analog. In various implementations, display 520 may be a holographic display. In addition, display 520 may be a transparent surface that may receive a visual projection. Such projections may convey various forms of information, images, and/or objects. For example, such projections may be a visual overlay for a mobile augmented reality (MAR) application. Under the control of one or more software applications 516, platform 502 may display user interface 522 on display 520.

In various implementations, content services device(s) 530 may be hosted by any national, international and/or independent service and thus accessible to platform 502 via the Internet, for example. Content services device(s) 530 may be coupled to platform 502 and/or to display 520. Platform 502 and/or content services device(s) 530 may be coupled to a network 560 to communicate (e.g., send and/or receive) media information to and from network 560. Content delivery device(s) 540 also may be coupled to platform 502 and/or to display 520.

In various implementations, content services device(s) 530 may include a cable television box, personal computer, network, telephone, Internet enabled devices or appliance capable of delivering digital information and/or content, and any other similar device capable of unidirectionally or bidirectionally communicating content between content providers and platform 502 and/display 520, via network 560 or directly. It will be appreciated that the content may be communicated unidirectionally and/or bidirectionally to and from any one of the components in system 500 and a content provider via network 560. Examples of content may include any media information including, for example, video, music, medical and gaming information, and so forth.

Content services device(s) 530 may receive content such as cable television programming including media information, digital information, and/or other content. Examples of content providers may include any cable or satellite television or radio or Internet content providers. The provided examples are not meant to limit implementations in accordance with the present disclosure in any way.

In various implementations, platform 502 may receive control signals from navigation controller 550 having one or more navigation features. The navigation features of controller 550 may be used to interact with user interface 522, for example. In embodiments, navigation controller 550 may be a pointing device that may be a computer hardware component (specifically, a human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of controller 550 may be replicated on a display (e.g., display 520) by movements of a pointer, cursor, focus ring, or other visual indicators displayed on the display. For example, under the control of software applications 516, the navigation features located on navigation controller 550 may be mapped to virtual navigation features displayed on user interface 522, for example. In embodiments, controller 550 may not be a separate component but may be integrated into platform 502 and/or display 520. The present disclosure, however, is not limited to the elements or in the context shown or described herein.

In various implementations, drivers (not shown) may include technology to enable users to instantly turn on and off platform 502 like a television with the touch of a button after initial boot-up, when enabled, for example. Program logic may allow platform 502 to stream content to media adaptors or other content services device(s) 530 or content delivery device(s) 540 even when the platform is turned "off." In addition, chipset 505 may include hardware and/or software support for 5.1 surround sound audio and/or high definition 7.1 surround sound audio, for example. Drivers may include a graphics driver for integrated graphics platforms. In embodiments, the graphics driver may comprise a peripheral component interconnect (PCI) Express graphics card.

In various implementations, any one or more of the components shown in system 500 may be integrated. For example, platform 502 and content services device(s) 530 may be integrated, or platform 502 and content delivery device(s) 540 may be integrated, or platform 502, content services device(s) 530, and content delivery device(s) 540 may be integrated, for example. In various embodiments, platform 502 and display 520 may be an integrated unit. Display 520 and content service device(s) 530 may be integrated, or display 520 and content delivery device(s) 540 may be integrated, for example. These examples are not meant to limit the present disclosure.

In various embodiments, system 500 may be implemented as a wireless system, a wired system, or a combination of both. When implemented as a wireless system, system 500 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 500 may include components and interfaces suitable for communicating over wired communications media, such as input/output (I/O) adapters, physical connectors to connect the I/O adapter with a corresponding wired communications medium, a network interface card (NIC), disc controller, video controller, audio controller, and the like. Examples of wired communications media may include a wire, cable, metal leads, printed circuit board (PCB), backplane, switch fabric, semiconductor material, twisted-pair wire, co-axial cable, fiber optics, and so forth.

Platform 502 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 5.

As described above, system 500 may be embodied in varying physical styles or form factors. FIG. 5 illustrates implementations of a small form factor device 500 in which system 500 may be embodied. In embodiments, for example, device 500 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In various embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

Figure 6:
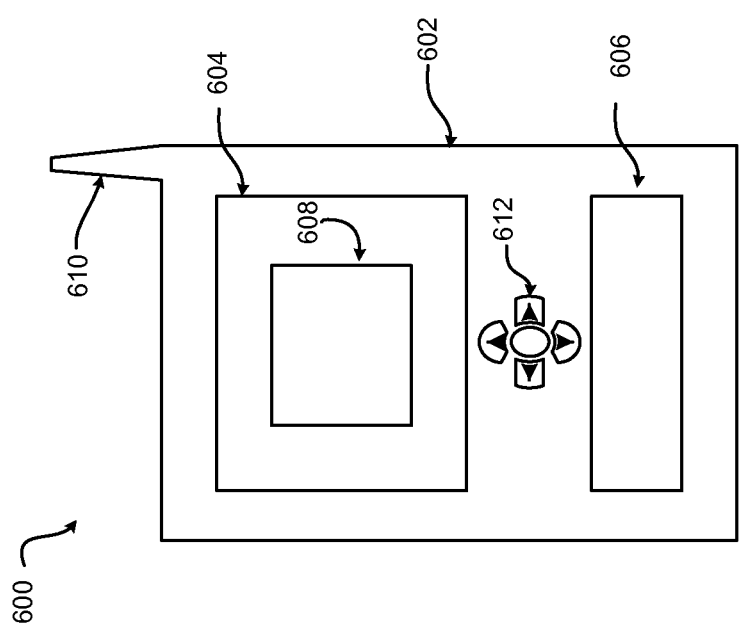
FIG. 6 illustrates an example device that utilizes the time interleaved digital to time converter (DTC) described in accordance with implementations herein.

As shown in FIG. 6, device 600 may include a housing 602, a display screen 604, an input/output (I/O) device 606, a network interface card (NIC) 608 and a transceiver component 610. Device 600 also may include navigation features 612. The display screen 604 may include any suitable display unit for displaying information appropriate for a mobile computing device. For example, the display screen 604 displays the personalized message that the personalized communication program may generate. The I/O device 606 may include any suitable I/O device or user interface (UI) for entering information into a mobile computing device such as when the user 102 opts-in to the personalized communication program. Examples for I/O device 606 may include an alphanumeric keyboard, a numeric keypad, a touch pad, input keys, buttons, switches, rocker switches, microphones, speakers, voice recognition device and software, and so forth. Information also may be entered into device 600 by way of microphone (not shown). Such information may be digitized by a voice recognition device (not shown). The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the various configurations may be implemented as a combined structure or component. These and other variations, modifications, additions, and improvements may fall within the scope of the invention as defined in the claims that follow.

The following examples pertain to further embodiments:

Example 1 is a device comprising: a near field communication device comprising: a digitally controlled oscillator; first and second digital-to-time converters (DTC) connected together in parallel, wherein the first and second DTCs are coupled to the digitally controlled oscillator; and a logic controller gate configured to combine outputs of the first and second DTCs to generate a phase modulated signal, wherein the first DTC or the second DTC comprises a frequency rate that is half the frequency rate of the phase modulated signal.

In example 2, the device as recited in example 1, wherein the digitally controlled oscillator is a voltage controlled oscillator (VCO).

In example 3, the device as recited in example 1 further comprising a synchronizer configured to synchronize the outputs of the first and second DTCS to be non-overlapping.

In example 4, the device as recited in example 3, wherein the synchronizer is configured to first activate the first DTC and then, two voltage controlled oscillator (VCO) cycles later, activate the second DTC.

In example 5, the device as recited in example 1, wherein the first DTC and the second DTC are independently operated and receive a separate phase control signal to generate the outputs of the first and second DTCs.

In example 6, the device as recited in example 1, wherein the first and second DTCs are configured to operate at a half rate duty cycle.

In example 7, the device as recited in example 1, wherein the first and second DTCs are configured to operate at a 25% duty cycle.

In example 8, the device as recited in example 1, wherein the phase modulated signal comprises an orthogonal phase modulated signal with 50% duty cycle.

In example 9, the device as recited in any of examples 1 to 8, wherein the logic controller gate is an "OR" gate that generates a high output when at least one of the first DTC or the second DTC outputs a high output.

Example 10 is a method of implementing a time interleaved digital-to-time converter (DTC), the method comprising: connecting a first DTC in parallel with a second DTC; configuring the parallel connected first DTC and the second DTC to operate at half rate and lower duty cycles; synchronizing the parallel connected first DTC and the second DTC; and combining a first DTC output and a second DTC output of the first DTC and the second DTC, respectively, to generate a phase modulated signal.

In example 11, the method as recited in example 10, wherein the parallel connected first DTC and the second DTC receive a signal from a voltage controlled oscillator (VCO), wherein the first and second DTCs are configured to operate at half a signal rate of the phase modulated signal.

In example 12, the method as recited in example 10, wherein the synchronizing comprises: activating the first DTC and after two voltage controlled oscillator (VCO) cycles, activating the second DTC.

In example 13, the method as recited in example 10, wherein a lower duty cycle is 25% duty cycle.

In example 14, the method as recited in any of examples 10 to 13, wherein the combining comprises generating a high output when the first DTC or the second DTC has a high output.

Example 15 is a time interleaved digital-to-time converter (DTC) comprising: a voltage controlled oscillator (VCO); a first digital-to-time converter (DTC) connected in parallel to a second DTC, the first and second DTCs are coupled to the VCO, wherein the first and second DTCs are configured to operate at a lower duty cycles; and a logic controller gate configured to combine outputs of the first and second DTCs to generate a phase modulated signal.

In example 16, the time interleaved DTC as recited in example 15 further comprising a synchronizer configured to facilitate non-overlapping of signals between the outputs of the first and second DTCs.

In example 17, the time interleaved DTC as recited in example 15 wherein the synchronizer is configured to activate the first DTC, and after two voltage controlled oscillator (VCO) cycles, the synchronizer activates the second DTC.

In example 18, the time interleaved DTC as recited in example 15 wherein the substantially lower duty cycle is 25% duty cycle, wherein the phase modulated signal comprises an orthogonal phase modulated signal with 50% duty cycle due to the 25% duty cycle in the first and second DTCs.

In example 19, the time interleaved DTC as recited in example 15, wherein the logic controller gate is an "OR" gate configured to generate a high output when the first DTC or the second DTC comprises a high output.

In example 20, the time interleaved DTC as recited in any of examples 15 to 19, wherein the first DTC and the second DTC are configured to operate at half-rate of the generated phase modulated signal.

What is claimed is:

1. A device comprising:
   a digitally controlled oscillator;
   first and second digital-to-time converters (DTC) connected together in parallel, wherein the first and second DTCs are coupled to the digitally controlled oscillator; and
   a logic controller gate configured to combine outputs of the first and second DTCs to generate a phase modulated signal, wherein the first DTC or the second DTC comprises a frequency rate that is half the frequency rate of the phase modulated signal.

2. The device as recited in claim 1, wherein the digitally controlled oscillator is a voltage controlled oscillator (VCO).

3. The device as recited in claim 1 further comprising a synchronizer configured to synchronize the outputs of the first and second DTCS to be non-overlapping.

4. The device as recited in claim 3, wherein the synchronizer is configured to first activate the first DTC and then, two voltage controlled oscillator (VCO) cycles later, activate the second DTC.

5. The device as recited in claim 1, wherein the first DTC and the second DTC are independently operated and receive a separate phase control signal to generate the outputs of the first and second DTCs.

6. The device as recited in claim 1, wherein the first and second DTCs are configured to operate at a half rate duty cycle.

7. The device as recited in claim 1, wherein the first and second DTCs are configured to operate at a 25% duty cycle.

8. The device as recited in claim 1, wherein the phase modulated signal comprises an orthogonal phase modulated signal with 50% duty cycle.

9. The device as recited in claim 1, wherein the logic controller gate is an "OR" gate that generates a high output when at least one of the first DTC or the second DTC outputs a high output.

10. A method of implementing a time interleaved digital-to-time converter (DTC), the method comprising:
    connecting a first DTC in parallel with a second DTC;
    configuring the parallel connected first DTC and the second DTC to operate at half rate and lower duty cycles;
    synchronizing the parallel connected first DTC and the second DTC; and
    combining a first DTC output and a second DTC output of the first DTC and the second DTC, respectively, to generate a phase modulated signal,
    wherein the half rate of the first DTC and second DTC is a frequency rate that is half the frequency rate of the phase modulated signal.

11. The method as recited in claim 10, wherein the parallel connected first DTC and the second DTC receive a signal from a voltage controlled oscillator (VCO), wherein the first and second DTCs are configured to operate at half a signal rate of the phase modulated signal.

12. The method as recited in claim 10, wherein the synchronizing comprises: activating the first DTC and after two voltage controlled oscillator (VCO) cycles, activating the second DTC.

13. The method as recited in claim 10, wherein a lower duty cycle is 25% duty cycle.

14. The method as recited in claim 10, wherein the combining comprises generating a high output when the first DTC or the second DTC has a high output.

15. A time interleaved digital-to-time converter (DTC) comprising:
- a voltage controlled oscillator (VCO);
- a first digital-to-time converter (DTC) connected in parallel to a second DTC, the first and second DTCs are coupled to the VCO, wherein the first and second DTCs are configured to operate at a lower duty cycles; and
- a logic controller gate configured to combine outputs of the first and second DTCs to generate a phase modulated signal,
- wherein the first DTC and the second DTC are configured to operate at half-rate of the generated phase modulated signal.

16. The time interleaved DTC as recited in claim 15 further comprising a synchronizer configured to facilitate non-overlapping of signals between the outputs of the first and second DTCs.

17. The time interleaved DTC as recited in claim 15 further comprising a synchronizer that is configured to activate the first DTC, and after two voltage controlled oscillator (VCO) cycles, the synchronizer activates the second DTC.

18. The time interleaved DTC as recited in claim 15 wherein the substantially lower duty cycle is 25% duty cycle, wherein the phase modulated signal comprises an orthogonal phase modulated signal with 50% duty cycle due to the 25% duty cycle in the first and second DTCs.

19. The time interleaved DTC as recited in claim 15, wherein the logic controller gate is an "OR" gate configured to generate a high output when the first DTC or the second DTC comprises a high output.

* * * * *